United States Patent
Yang et al.

(10) Patent No.: US 11,362,245 B2
(45) Date of Patent: Jun. 14, 2022

(54) SEMICONDUCTOR STRUCTURE AND MICRO SEMICONDUCTOR DISPLAY DEVICE

(71) Applicant: PlayNitride Display Co., Ltd., Zhunan Township, Miaoli County (TW)

(72) Inventors: Shiang-Ning Yang, Zhunan Township (TW); Chih-Ling Wu, Zhunan Township (TW); Yi-Min Su, Zhunan Township (TW); Bo-Wei Wu, Zhunan Township (TW)

(73) Assignee: PLAYNITRIDE DISPLAY CO., LTD., Zhunan Township (TW)

( * ) Notice: Subject to any disclaimer, the term of this patent is extended or adjusted under 35 U.S.C. 154(b) by 62 days.

(21) Appl. No.: 16/585,794

(22) Filed: Sep. 27, 2019

(65) Prior Publication Data

US 2021/0020816 A1 Jan. 21, 2021

(30) Foreign Application Priority Data

Jul. 17, 2019 (TW) .................................. 108125211

(51) Int. Cl.
*H01L 33/62* (2010.01)
*H01L 31/14* (2006.01)
(Continued)

(52) U.S. Cl.
CPC .......... *H01L 33/62* (2013.01); *H01L 25/0753* (2013.01); *H01L 31/143* (2013.01); *H01L 31/162* (2013.01)

(58) Field of Classification Search
CPC ..... H01L 33/62; H01L 25/0753; H01L 24/00; H01L 33/00–648; H01L 27/15–156; H01L 31/143; H01L 31/162
See application file for complete search history.

(56) References Cited

U.S. PATENT DOCUMENTS 9,859,459 B2 * 1/2018 Ting .................... H01L 25/0753
10,263,138 B2 * 4/2019 Lu ....................... H01L 33/0095
(Continued)

FOREIGN PATENT DOCUMENTS

TW 201417239 A 5/2014
TW 201839970 A 11/2018
(Continued)

OTHER PUBLICATIONS

Taiwanese Office Action and Search Report, dated Mar. 9, 2020, for Taiwanese Application No. 108125211.

*Primary Examiner* — Shahed Ahmed
*Assistant Examiner* — Khatib A Rahman
(74) *Attorney, Agent, or Firm* — Birch, Stewart, Kolasch & Birch, LLP

(57) ABSTRACT

A semiconductor structure includes a substrate, a plurality of micro semiconductor devices and a fixing structure. The micro semiconductor devices are disposed on the substrate. The fixing structure is disposed between the substrate and the micro semiconductor devices. The fixing structure includes a plurality of conductive layers and a plurality of supporting layers. The conductive layers are disposed on the lower surfaces of the micro semiconductor devices. The supporting layers are connected to the conductive layers and the substrate. The material of each of the conductive layers is different from the material of each of the supporting layers.

13 Claims, 10 Drawing Sheets

(51) Int. Cl.
    *H01L 25/075*     (2006.01)
    *H01L 31/16*     (2006.01)

(56) References Cited

U.S. PATENT DOCUMENTS

| | | | |
|---|---|---|---|
| 10,886,446 B2* | 1/2021 | Ahn | H01L 33/62 |
| 2009/0095502 A1* | 4/2009 | Jadhav | H01L 24/11 |
| | | | 174/126.2 |
| 2013/0146915 A1* | 6/2013 | Huang | H01L 33/382 |
| | | | 257/98 |
| 2014/0203308 A1* | 7/2014 | Tischler | H01L 27/14 |
| | | | 257/88 |
| 2017/0062650 A1* | 3/2017 | Chen | H01L 24/29 |
| 2017/0170160 A1* | 6/2017 | Yen | H01L 27/1262 |
| 2017/0229430 A1* | 8/2017 | Lai | H01L 25/0753 |
| 2018/0277591 A1* | 9/2018 | Wu | H01L 33/60 |
| 2019/0157563 A1 | 5/2019 | Bower et al. | |
| 2019/0189496 A1* | 6/2019 | Chen | H01L 21/6835 |
| 2019/0214963 A1* | 7/2019 | Shin | H03H 9/02897 |
| 2020/0411739 A1* | 12/2020 | Wu | H01L 25/0753 |
| 2021/0265327 A1* | 8/2021 | Koo | H01L 33/62 |
| 2021/0320090 A1* | 10/2021 | Lo | H01L 33/0093 |
| 2021/0408105 A1* | 12/2021 | Kishimoto | H01L 33/44 |

FOREIGN PATENT DOCUMENTS

| | | |
|---|---|---|
| TW | 201916342 A | 4/2019 |
| TW | 201916343 A | 4/2019 |
| TW | 201919224 A | 5/2019 |

* cited by examiner

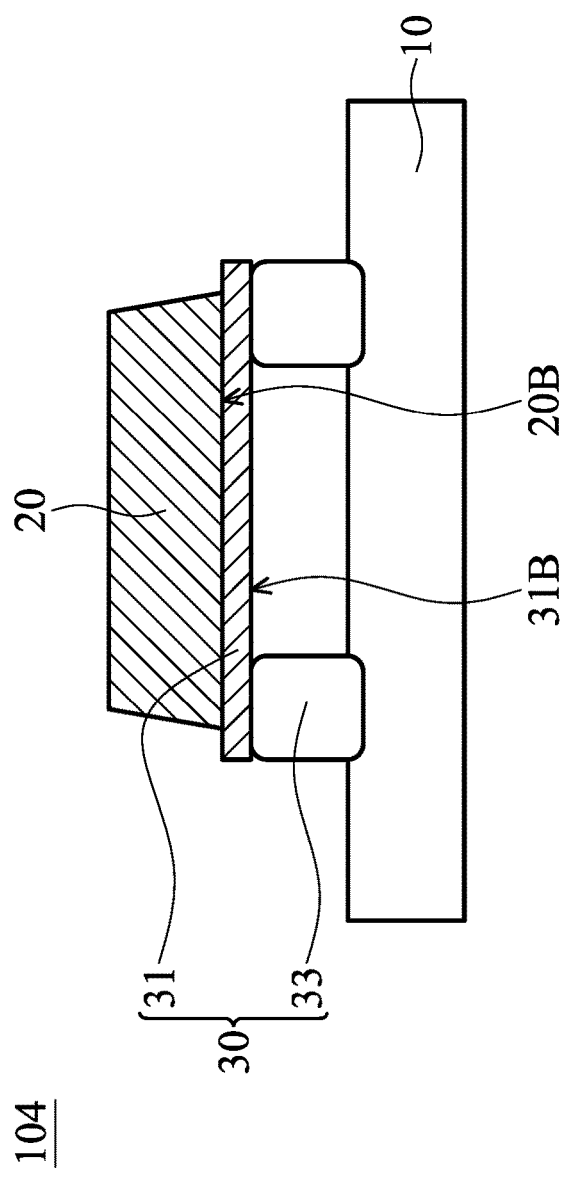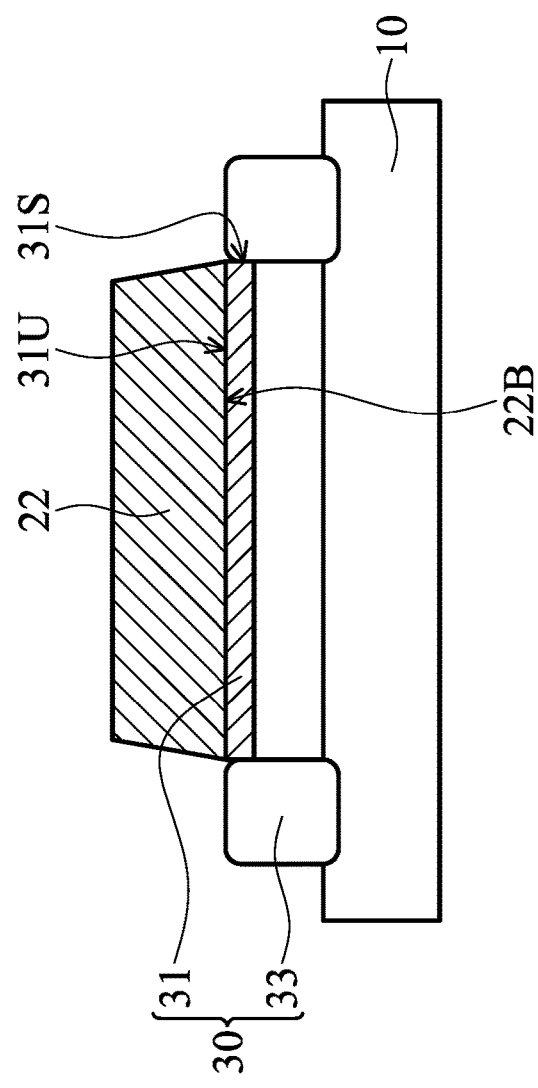

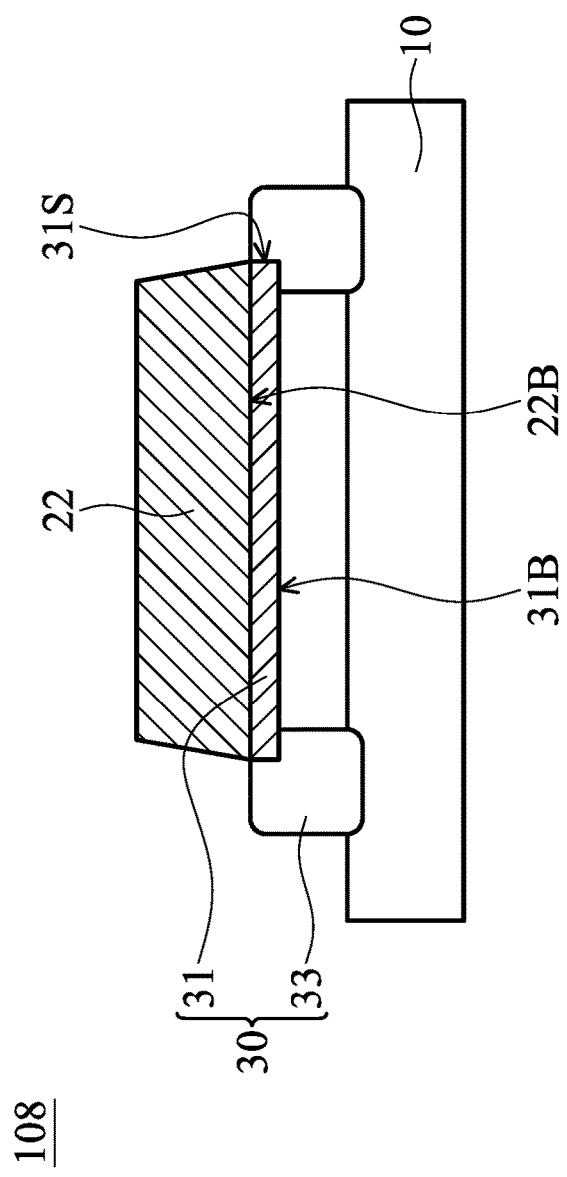
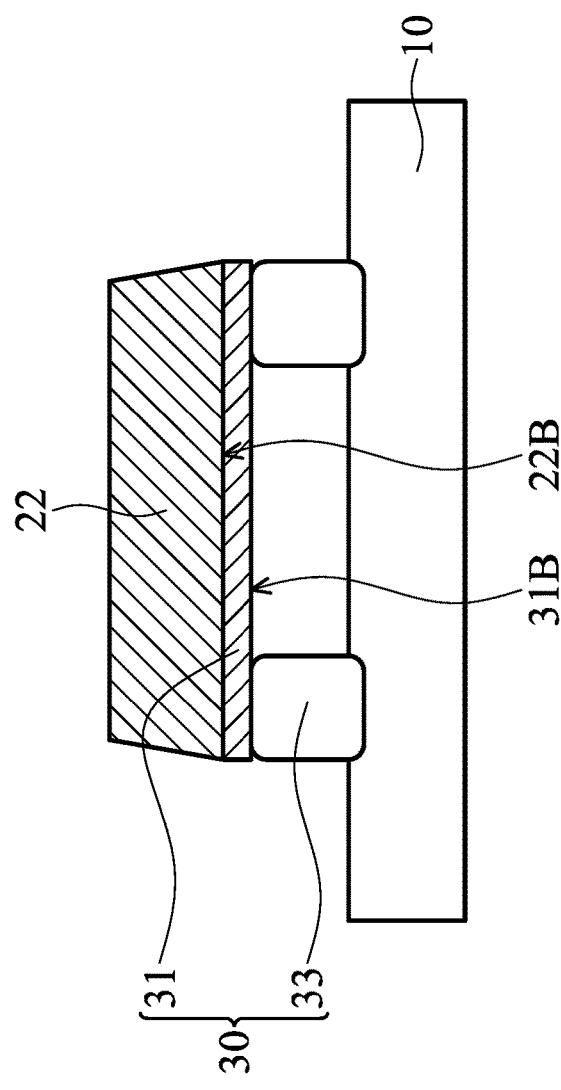

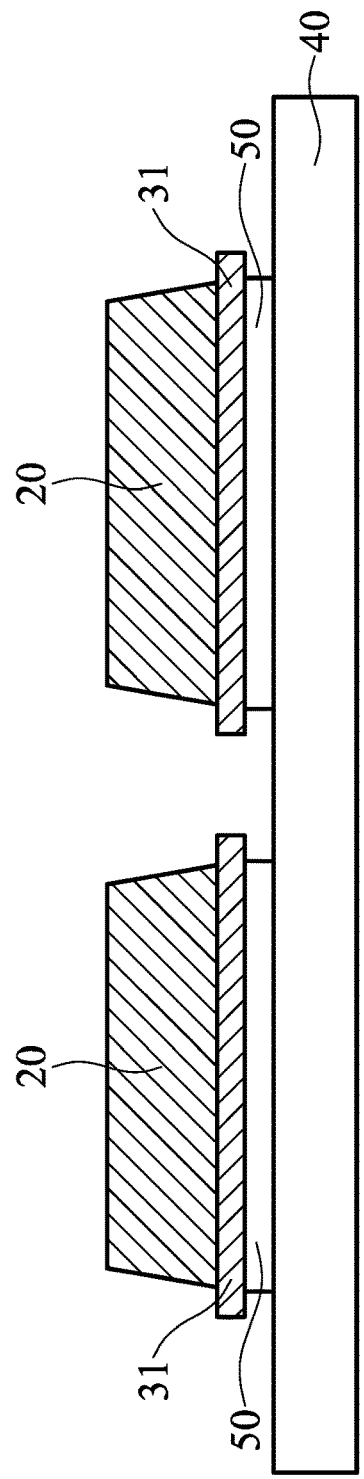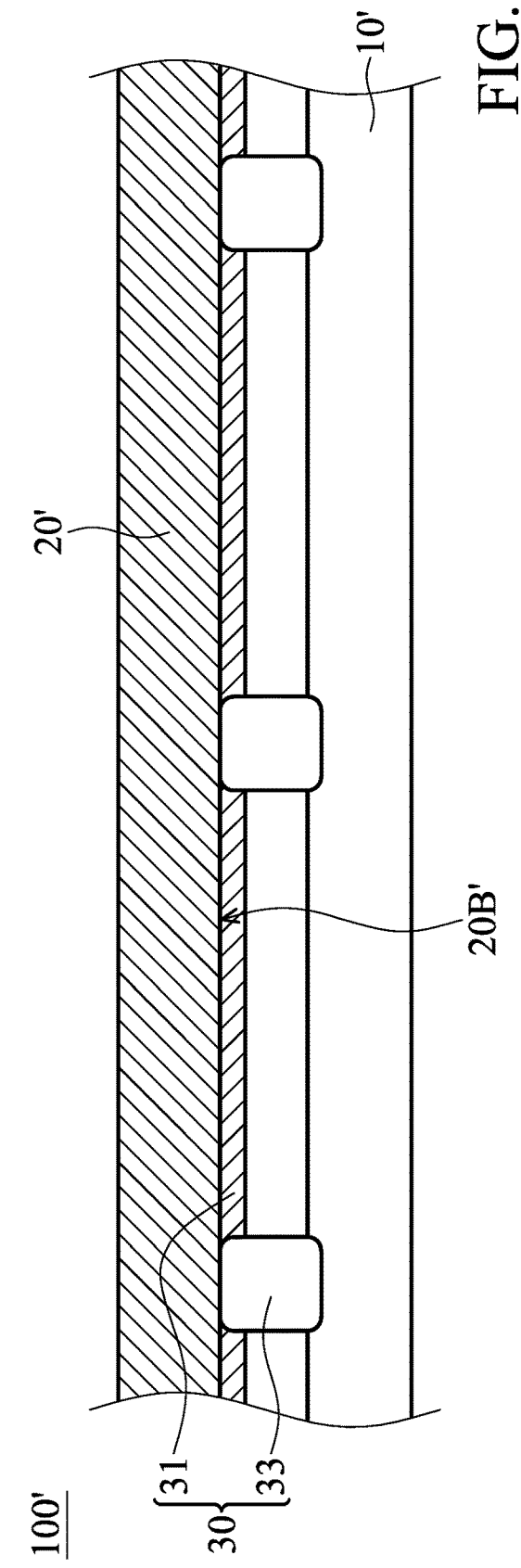

SEMICONDUCTOR STRUCTURE AND MICRO SEMICONDUCTOR DISPLAY DEVICE

CROSS REFERENCE TO RELATED APPLICATIONS

This application claims the benefit of Taiwan Application No. 108125211, filed Jul. 17, 2019, the entirety of which is incorporated by reference herein.

BACKGROUND

Technical Field

Embodiments of the present disclosure relate to a semiconductor structure, and in particular they relate to a micro semiconductor structure and a micro semiconductor display device.

Description of the Related Art

In recent years, due to breakthroughs in the size of light-emitting diodes (LEDs), micro light-emitting diodes that are arranged in an array are gradually gaining importance in the market. Micro light-emitting diode displays are active micro-semiconductor component displays, which are more power efficient and have better contrast performance for better visibility in sunlight than organic micro semiconductor diode (OLED) displays. Moreover, since light-emitting diode displays use inorganic materials, they have better reliability and longer service life than organic light-emitting diode displays.

Micro light-emitting diodes still have some disadvantages. For example, the light-emitting diode is often held by a fixing structure (tether) to make the micro light-emitting diode easier to pick up from the carrier substrate and transfer to the receiving substrate, and the micro light-emitting diode is consolidated by the fixing structure, so that the quality of the micro light-emitting diode is not affected by external influences during transfer. However, after the micro light-emitting diode is transferred to the receiving substrate, the fixing structure may remain, resulting in poor electrode contact of the micro light-emitting diode, and resulting in a decrease in the performance of the micro light emitting diode.

Therefore, although existing micro light-emitting diodes have roughly met the requirements placed upon them, there are still many problems. How to improve upon existing micro light-emitting diodes has become a topic of great concern in the industry.

SUMMARY

Some embodiments of the present disclosure include a semiconductor structure. The semiconductor structure includes a substrate, a plurality of micro semiconductor devices and a fixing structure. The micro semiconductor devices are disposed on the substrate. The fixing structure is disposed between the substrate and the micro semiconductor devices. The fixing structure includes a plurality of conductive layers and a plurality of supporting layers. The conductive layers are disposed on the lower surfaces of the micro semiconductor devices. The supporting layers are connected to the conductive layers and the substrate. The material of each of the conductive layers is different from the material of each of the supporting layers.

Some embodiments of the present disclosure include a micro semiconductor display device. The micro semiconductor display device includes a receiving substrate, a plurality of micro semiconductor devices and a plurality of conductive layers. The micro semiconductor devices are disposed on the receiving substrate. The conductive layers are disposed between the receiving substrate and the micro semiconductor devices. The area of the orthogonal projection of the micro semiconductor device on the receiving substrate is smaller than the area of the orthogonal projection of the corresponding conductive layer on the receiving substrate.

Some embodiments of the present disclosure include a semiconductor structure. The semiconductor structure includes a substrate, an epitaxial structure and a fixing structure. The epitaxial structure is disposed on the substrate. The fixing structure is disposed between the substrate and the epitaxial structure. The fixing structure includes a plurality of conductive layers and a plurality of supporting layers. The conductive layers are disposed on the lower surface of the epitaxial structure. The supporting layers are connected to the conductive layers and the substrate. The material of each of the conductive layers is different from the material of each of the supporting layers.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3 is a partial cross-sectional view illustrating a semiconductor structure according to another embodiment of the present disclosure.

FIG. 4 is a partial cross-sectional view illustrating a semiconductor structure according to one embodiment of the present disclosure.

FIG. 5 is a partial cross-sectional view illustrating a semiconductor structure according to another embodiment of the present disclosure.

FIG. 6 is a partial cross-sectional view illustrating a semiconductor structure according to another embodiment of the present disclosure.

FIG. 19 is a partial cross-sectional view illustrating a micro semiconductor display device according to one embodiment of the present disclosure.

FIG. 20 is a partial cross-sectional view illustrating a semiconductor structure according to one embodiment of the present disclosure.

DETAILED DESCRIPTION

Figure 1:
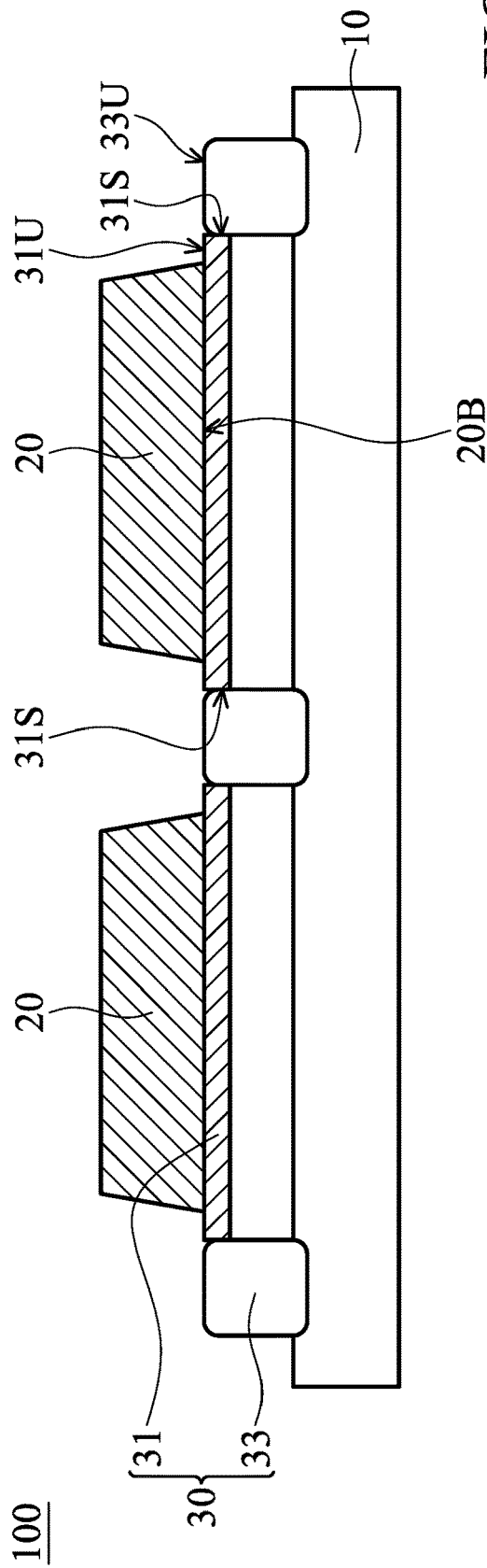
FIG. 1 is a partial cross-sectional view illustrating a semiconductor structure according to one embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−5% of the stated value, more typically more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

It should be noted that some components may be omitted in the various figures in order to more clearly illustrate the features of the various embodiments of the present disclosure.

FIG. 1 is a partial cross-sectional view illustrating a semiconductor structure 100 according to one embodiment of the present disclosure. As shown in FIG. 1, the semiconductor substrate 100 includes a substrate 10. In some embodiments, the substrate 10 may be, for example, a carrier substrate, which may include a flexible substrate, a glass substrate, a sapphire substrate or other substrates without wiring, but the present disclosure is not limited thereto.

As shown in FIG. 1, the semiconductor structure 100 includes a plurality of micro semiconductor devices 20 disposed on the substrate 10. In some embodiments, the micro semiconductor devices 20 may be, for example, micro light-emitting diodes (micro LED) or microchips, and subsequently, the micro semiconductor devices 20 may be transferred and assembled onto a receiving substrate to form a heterogeneous integrated system, such as a micro semiconductor display of any size, including from a wearable display to a large-area display.

Here, the term "micro" means that the semiconductor device 20 may have a size of between 1 μm and 100 μm. For example, the micro semiconductor device 20 may have a maximum width of 20 μm, 10 μm or 5 μm, and the micro semiconductor device 20 may have a maximum height of less than 10 μm or 5 μm, but the present disclosure is not limited thereto. In other embodiments, the micro semiconductor device 20 may have a larger or smaller size.

In some embodiments, the micro semiconductor device 20 may include p-n diodes, but the present disclosure is not limited thereto. In some embodiments, the micro semiconductor device 20 includes, for example, a micro semiconductor device 20 capable of controlling and performing predetermined electronic functions (e.g., a diode, a transistor, an integrated circuit) or a micro semiconductor device 20 having photo functions (e.g., a light-emitting diode, a laser diode, a photo diode). In some embodiments, the micro semiconductor device 20 may also be applied to a microchip with a circuit, such as a microchip that is made of a silicon wafer or a semiconductor-on-insulator (SOI) wafer and used for logic or memory applications, or a microchip that is made of gallium arsenide (GaAs) wafer and used for radio frequency (RF) communication applications, but the present disclosure is not limited thereto.

In some embodiments, the micro semiconductor device 20 may be an epitaxial structure (not shown in detail in FIG.

1). The epitaxial structure may include a first-type semiconductor layer, a second-type semiconductor layer and a light-emitting layer, but the present disclosure is not limited thereto. For example, the first-type semiconductor layer may be an N-type semiconductor layer, and the second-type semiconductor layer may be a P-type semiconductor layer. In some embodiments, the thickness of the N-type semiconductor layer may be greater than the thickness of the P-type semiconductor layer, but the present disclosure is not limited thereto.

In some embodiments, the height and width of the N-type semiconductor layer may be greater than the height and width of the P-type semiconductor layer. That is, the micro semiconductor device 20 (epitaxial structure) may be formed as the trapezoidal structure as shown in FIG. 1. Here, the difference between the maximum width of the N-type semiconductor layer and the maximum width of the P-type semiconductor layer may be between 0 and 5 µm, but the present disclosure is not limited thereto.

As shown in FIG. 1, the semiconductor structure 100 includes a fixing structure 30 disposed between the substrate 10 and the micro semiconductor devices 20. In particular, the fixing structure 30 may include a plurality of conductive layers 31 and a plurality of supporting layers 33. The conductive layers 31 are disposed on the lower surfaces 20B of the micro semiconductor devices 20, and the supporting layers 33 are connected to the conductive layers 31 and the substrate 10. In this embodiment, the supporting layer 33 is in direct contact with the side surface 31S of the connected conductive layer 31, and the orthogonal projection of the supporting layer 33 on the substrate 10 and the orthogonal projection of the conductive layer 31 on the substrate 10 do not overlap, but the present disclosure is not limited thereto. Here, the lower surfaces 20B of the micro semiconductor devices 20, the upper surfaces 33U of the supporting layers 33 and the upper surfaces 31U of the conductive layers 31 are coplanar. That is, the fixing structure 30 is merely arranged on the lower surfaces 20B of the micro semiconductor devices 20 and is not in contact with other surfaces of the micro semiconductor devices 20, thereby preventing the fixing structure 30 from remaining on other surfaces of the micro semiconductor devices 20.

In the embodiments of the present disclosure, the material of each of the conductive layers 31 is different from the material of each of the supporting layers 33. For example, the material of the conductive layer 31 may include a metal (e.g., tin, gold, copper), a conductive polymer (e.g., an anisotropic conductive film), a metal oxide (e.g., indium tin oxide (ITO)), other applicable conductive materials, or a combination of thereof; the material of the supporting layer 33 may be a non-conductive material, for example, including an organic material (e.g., a photoresist material), an inorganic material (e.g., silicon oxide, silicon nitride, silicon oxynitride) or a combination thereof, but the present disclosure is not limited thereto. In some embodiments, the Young's modulus of the conductive layer 31 may be greater than the Young's modulus of the supporting layer 33, so that the supporting layer 33 connected to the substrate 10 and the conductive layer 31 may provide better buffer support in subsequent transfer.

Since the fixing structure 30 in the embodiments of the present disclosure includes the conductive layer 31 and the supporting layer 33, and the conductive layer 31 and the supporting layer 33 are heterogeneous materials, when the micro semiconductor device 20 is subsequently transferred to a receiving substrate (e.g., a display back plate), it is easier to break from the hetero interface (i.e., the boundary between the conductive layer 31 and the supporting layer 33), so that the supporting layer 33 is less likely to remain on the micro semiconductor device 20, and the circuit contact failure of the micro semiconductor device 20 may be avoided, thereby effectively improving the performance of a subsequently formed heterogeneous integrated system (e.g., a micro light-emitting diode display device). Moreover, the conductive layer 31 of the fixing structure 30 may directly serve as an electrode of the micro semiconductor device 20 (and does not require an additional process), which may further reduce the process time and manufacturing cost of the semiconductor structure 100.

Figure 2:
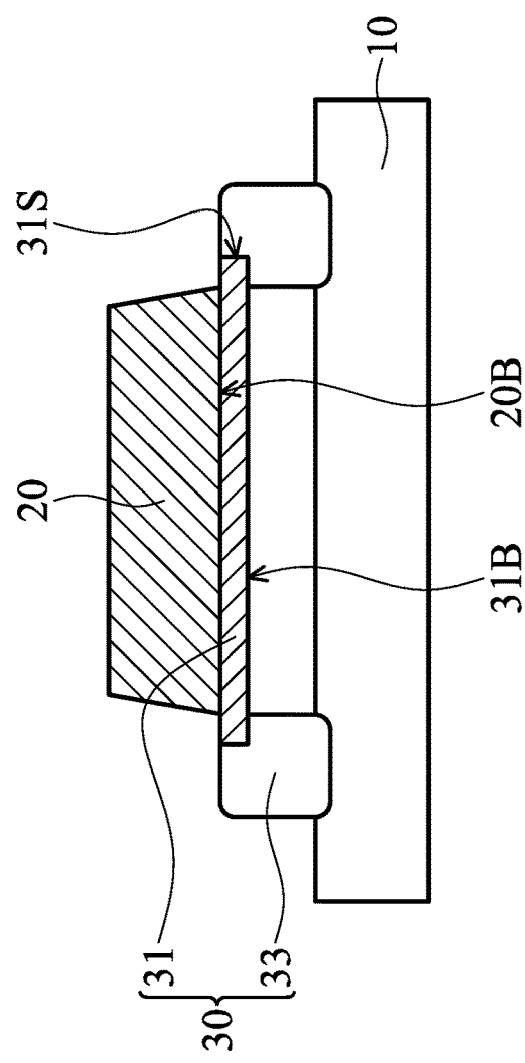
FIG. 2 is a partial cross-sectional view illustrating a semiconductor structure according to another embodiment of the present disclosure.

FIG. 2 is a partial cross-sectional view illustrating a semiconductor structure 102 according to another embodiment of the present disclosure. Similarly, the semiconductor substrate 102 includes a substrate 10, a plurality of micro semiconductor devices 20 and a fixing structure 30. It should be noted that FIG. 2 shows only one micro semiconductor device 20, for sake of brevity. As shown in FIG. 2, the micro semiconductor device 20 is disposed on the substrate 10, and the fixing structure 30 is disposed between the micro semiconductor device 20 and the substrate 10.

Moreover, the fixing structure 30 may include a plurality of conductive layers 31 and a plurality of supporting layers 33, the material of each of the conductive layers 31 is different from the material of each of the supporting layers 33, and no further description is made here. Similarly, FIG. 2 shows only one conductive layer 31, for sake of brevity. As shown in FIG. 2, the conductive layer 31 is disposed on the lower surface 20B of the micro semiconductor device 20, and the supporting layers 33 are connected to the conductive layer 31 and the substrate 10.

The difference from the semiconductor structure 100 shown in FIG. 1 is that each of the supporting layers 33 of the semiconductor structure 102 shown in FIG. 2 is simultaneously in direct contact with the side surface 31S and the lower surface 31B of the connected conductive layer 31. That is, the orthogonal projection of the supporting layer 33 on the substrate 10 partially overlap the orthogonal projection of the conductive layer 31 on the substrate 10, so that the contact area between the supporting layer 33 and the conductive layer 31 is large, thereby providing better buffering function, but the present disclosure is not limited thereto. Here, the orthogonal projection of supporting layer 33 on the substrate 10 does not overlap the orthogonal projection of the micro semiconductor device 20 on the substrate 10, thereby avoiding the efficiency of subsequent transfer.

FIG. 3 is a partial cross-sectional view illustrating a semiconductor structure 104 according to another embodiment of the present disclosure. The difference from the semiconductor structure 102 shown in FIG. 2 is that each of the supporting layers 33 of the semiconductor structure 104 shown in FIG. 3 is in direct contact with the lower surface 31B of the connected conductive layer 31, and the orthogonal projection of the supporting layer 33 on the substrate 10 is disposed inside the orthogonal projection of the conductive layer 31 on the substrate 10, but the present disclosure is not limited thereto. Here, the supporting layer 33 is aligned with the conductive layer 31 (one side surface of the supporting layer 33 and one side surface of the conductive layer 31 are coplanar). However, in an embodiment not shown, the supporting layer 33 may also be retracted into the orthogonal projection of the micro semiconductor device 20 on the substrate 10 and near the center of gravity of the micro semiconductor device 20, for providing a better support. In some embodiments, the ratio of the area of the orthogonal projection of each of the supporting layers 33 on the substrate 10 to the area of the orthogonal projection of the conductive layer 31 on the substrate 10 may be less than 0.5. If the ratio is greater than or equal to 0.5, the supporting layer 33 and the conductive layer 31 may be difficult to separate.

In the semiconductor structure 100 shown in FIG. 1, the semiconductor structure 102 shown in FIG. 2 and the semiconductor structure 104 shown in FIG. 3, the area of the orthogonal projection of each of the micro semiconductor devices 20 on the substrate 10 is smaller than the area of the orthogonal projection of the corresponding conductive layer 31 on the substrate 10. For example, the ratio of the area of the orthogonal projection of each of the micro semiconductor devices 20 on the substrate 10 to the area of the orthogonal projection of the corresponding conductive layer 31 on the substrate 10 may be greater than or equal to 0.5, and less than 1. If the ratio is less than 0.5, the fixing structure 30 may occupy an excessive space, and the utilization ratio of the micro semiconductor device 20 is reduced.

FIG. 4 is a partial cross-sectional view illustrating a semiconductor structure 106 according to one embodiment of the present disclosure. The difference from the semiconductor structure 100 shown in FIG. 1 is that in the semiconductor structure 106 shown in FIG. 4, the area of the orthogonal projection of each of the micro semiconductor devices 22 on the substrate 10 is equal to the area of the orthogonal projection of the corresponding conductive layer 31 on the substrate 10. That is, the lower surface 22B of the micro semiconductor device 22 has the same area and the same shape as the upper surface 31U of the corresponding conductive layer 31, and the micro semiconductor device 22 may have a better bonding yield in subsequent transfer, but the present disclosure is not limited thereto.

FIG. 5 is a partial cross-sectional view illustrating a semiconductor structure 108 according to another embodiment of the present disclosure. The difference from the semiconductor structure 102 shown in FIG. 2 is that in the semiconductor structure 108 shown in FIG. 5, the area of the orthogonal projection of each of the micro semiconductor devices 22 on the substrate 10 is equal to the area of the orthogonal projection of the corresponding conductive layer 31 on the substrate 10, but the present disclosure is not limited thereto.

FIG. 6 is a partial cross-sectional view illustrating a semiconductor structure 110 according to another embodiment of the present disclosure. The difference from the semiconductor structure 104 shown in FIG. 3 is that in the semiconductor structure 110 shown in FIG. 6, the area of the orthogonal projection of each of the micro semiconductor devices 22 on the substrate 10 is equal to the area of the orthogonal projection of the corresponding conductive layer 31 on the substrate 10, but the present disclosure is not limited thereto.

Figure 7:
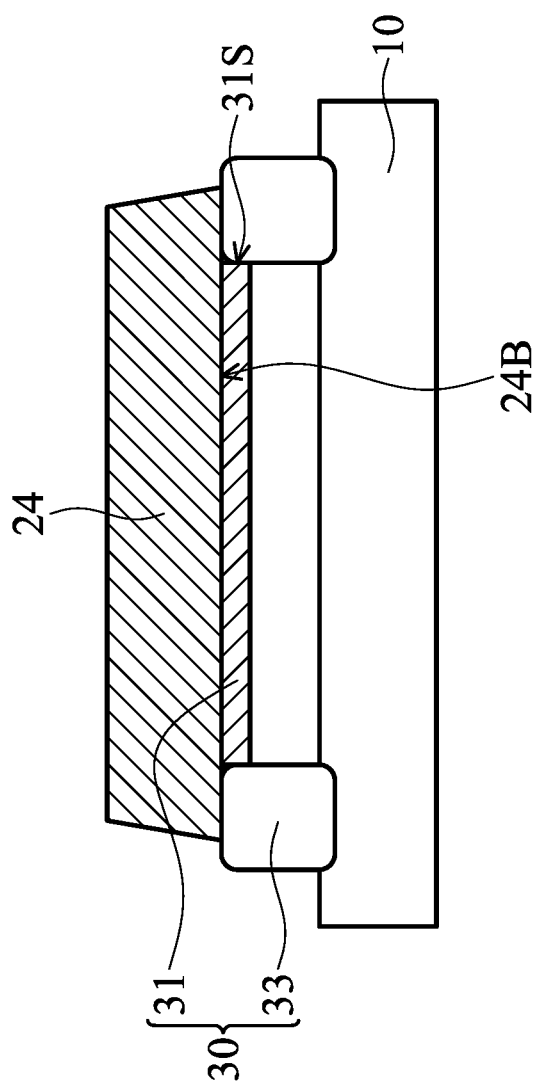
FIG. 7 is a partial cross-sectional view illustrating a semiconductor structure according to one embodiment of the present disclosure.

FIG. 7 is a partial cross-sectional view illustrating a semiconductor structure 112 according to one embodiment of the present disclosure. The semiconductor structure 112 shown in FIG. 7 is similar to the semiconductor structure 100 shown in FIG. 1. Each of the supporting layers 33 of the semiconductor structure 112 is in direct contact with the side surface 31S of the connected conductive layer 31, the orthogonal projection of the supporting layer 33 on the substrate 10 and the orthogonal projection of the conductive layer 31 on the substrate 10 do not overlap, and other similarities are not described herein.

The difference from the semiconductor structure 100 shown in FIG. 1 is that in the semiconductor structure 112 shown in FIG. 7, the area of the orthogonal projection of each of the micro semiconductor devices 24 on the substrate 10 is larger than the area of the orthogonal projection of the corresponding conductive layer 31 on the substrate 10, and the lower surface 24B of the micro semiconductor device 24 may be in direct contact with the supporting layers 33 (e.g., the P-type semiconductor layer of the micro semiconductor device 24 may be in direct contact with the top surface of the supporting layer 33), so that the micro semiconductor device 24 is more easily broken from the heterogeneous interface (i.e., the boundary between the conductive layer 31 and the supporting layer 33, the boundary between the micro semiconductor device 24 and the supporting layer 33), but the present disclosure is not limited thereto. In some embodiments, the ratio of the contact area of the micro semiconductor device 24 to the supporting layer 33 to the area of the lower surface 24B of the micro semiconductor device 24 is less than or equal to 0.2. If the ratio is greater than 0.2, it the subsequent transfer yield may affect.

Figure 8:
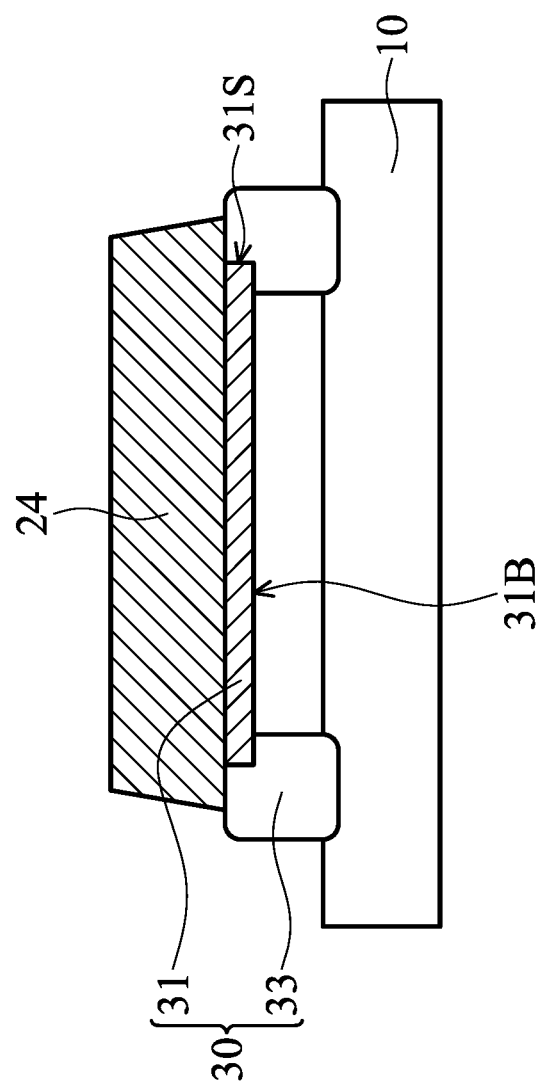
FIG. 8 is a partial cross-sectional view illustrating a semiconductor structure according to another embodiment of the present disclosure.

FIG. 8 is a partial cross-sectional view illustrating a semiconductor structure 114 according to another embodiment of the present disclosure. The difference from the semiconductor structure 112 shown in FIG. 7 is that each of the supporting layers 33 of the semiconductor structure 114 shown in FIG. 8 is simultaneously in direct contact with the side surface 31S and the lower surface 31B of the connected conductive layer 31. That is, the orthogonal projection of the supporting layer 33 on the substrate 10 may partially overlap the orthogonal projection of the conductive layer 31 on the substrate 10, but the present disclosure is not limited thereto.

Figure 9:
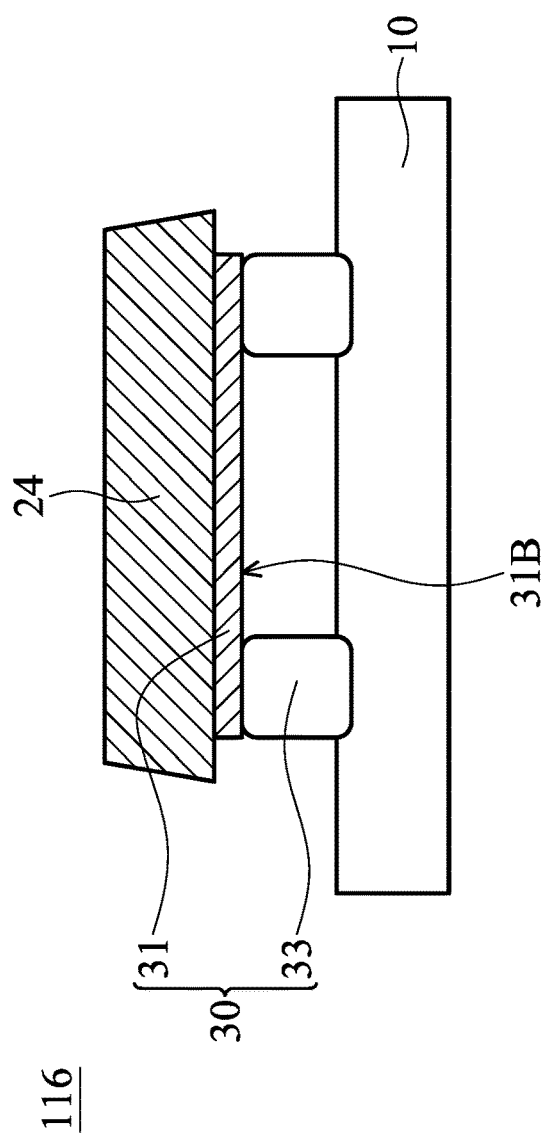
FIG. 9 is a partial cross-sectional view illustrating a semiconductor structure according to another embodiment of the present disclosure.

FIG. 9 is a partial cross-sectional view illustrating a semiconductor structure 116 according to another embodiment of the present disclosure. The difference from the semiconductor structure 112 shown in FIG. 7 is that each of the supporting layers 33 of the semiconductor structure 116 shown in FIG. 9 is in direct contact with the lower surface 31B of the connected conductive layer 31, and the orthogonal projection of the supporting layer 33 on the substrate 10 may be disposed inside the orthogonal projection of the conductive layer 31 on the substrate 10, but the present disclosure is not limited thereto.

Figure 10:
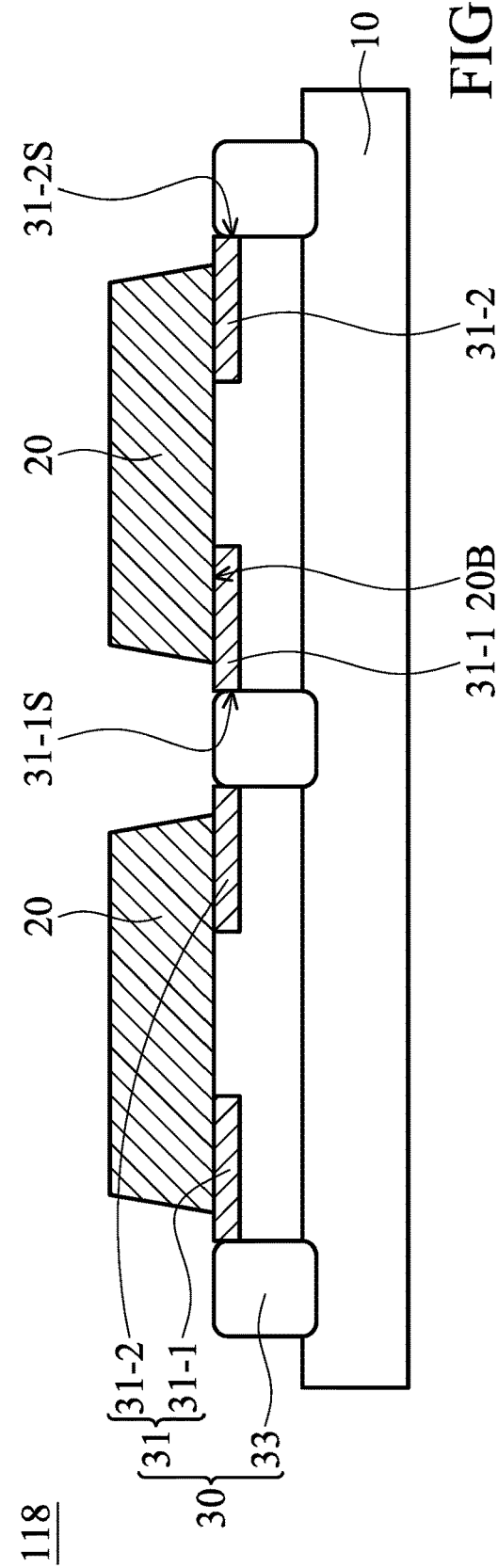
FIG. 10 is a partial cross-sectional view illustrating a semiconductor structure according to one embodiment of the present disclosure.

FIG. 10 is a partial cross-sectional view illustrating a semiconductor structure 118 according to one embodiment of the present disclosure. The difference from the semiconductor structure 100 shown in FIG. 1 is that in the semiconductor structure 118 shown in FIG. 10, each of the conductive layers 31 includes a first conductive portion 31-1 and a second conductive portion 31-2, and the first conductive portion 31-1 and the second conductive portion 31-2 are separated from each other, but the present disclosure is not limited thereto. In particular, the first conductive portion 31-1 and the second conductive portion 31-2 may have opposite electrical properties. In some embodiments, the first conductive portion 31-1 may be, for example, a first-type electrode which is electrically connected to the first-type semiconductor layer; the second conductive portion 31-2 may be, for example, a second-type electrode which is electrically connected to the second-type semiconductor layer, but the present disclosure is not limited thereto. After the subsequent transfer, the micro semiconductor device 20 may be directly bonded to the receiving substrate without forming a conductive electrode on the other side. In other words, the micro semiconductor device 20 may be a flip chip micro semiconductor device.

Moreover, each of the supporting layers 33 is in direct contact with the side surface of the connected conductive layer 31 as shown in FIG. 10. Specifically, the support layer 33 may be in direct contact with the side surface 31-1S of the first conductive portion 31-1 and the side surface 31-2S of the second conductive portion 31-2, and the orthogonal projection of the support layer 33 on the substrate 10 and the orthogonal projection of the first conductive portion 31-1 and the second conductive portion 31-2 on the substrate 10 do not overlap, but the present disclosure is not limited thereto.

In other embodiments, each of the supporting layers 33 may be simultaneously in direct contact with the side surface 31-1S (or 31-2S) and the lower surface of the connected first conductive portion 31-1 (or second conductive portion 31-2). That is, the orthogonal projection of the supporting layer 33 on the substrate 10 may partially overlap the orthogonal projection of the first conductive portion 31-1 (or second conductive portion 31-2) on the substrate 10. In other embodiments, each of the supporting layers 33 may be in direct contact with the lower surface of the connected first conductive portion 31-1 (or second conductive portion 31-2), and the orthogonal projection of the supporting layer 33 on the substrate 10 may be disposed inside the orthogonal projection of the first conductive portion 31-1 (or second conductive portion 31-2) on the substrate 10.

Figure 11:
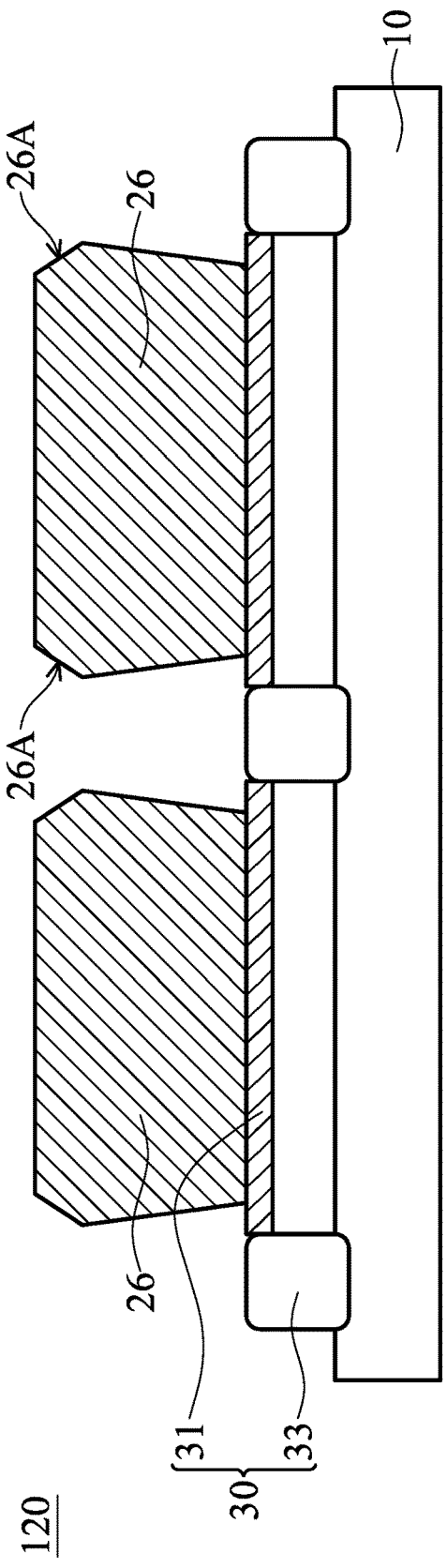
FIG. 11 is a partial cross-sectional view illustrating a semiconductor structure according to another embodiment of the present disclosure.

FIG. 11 is a partial cross-sectional view illustrating a semiconductor structure 120 according to another embodiment of the present disclosure. The semiconductor structure 120 shown in FIG. 11 is similar to the semiconductor structure 100 shown in FIG. 1. The difference from the semiconductor structure 100 shown in FIG. 1 is that in the semiconductor structure 120 shown in FIG. 10, each of the micro semiconductor devices 26 has at least one lead angle or round corner 26A. When the micro semiconductor devices 26 are applied to the photoelectric elements, the lead angle or the round corner 26A may improve the light-emitting efficiency at the lateral and forward boundary of each of the micro semiconductor devices 26, but the present disclosure is not limited thereto.

Figure 12:
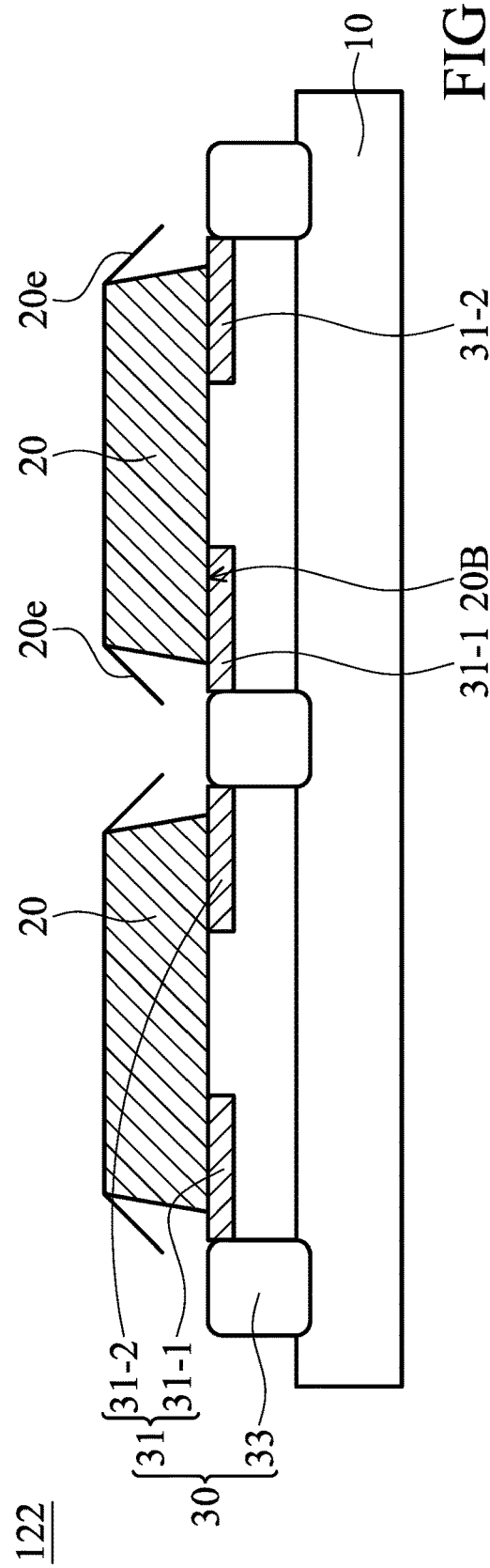
FIG. 12 is a partial cross-sectional view illustrating a semiconductor structure according to another embodiment of the present disclosure.

FIG. 12 is a partial cross-sectional view illustrating a semiconductor structure 122 according to another embodiment of the present disclosure. The semiconductor structure 122 shown in FIG. 12 is similar to the semiconductor structure 118 shown in FIG. 10. The difference from the semiconductor structure 118 shown in FIG. 10 is that in the semiconductor structure 122 shown in FIG. 12 may further include a plurality of light-out structures 20e that may be disposed on the micro semiconductor devices 20. For example, each of the light-out structures 20e may be connected to the top surface of the semiconductor device 20 and extended to the outside, but the present disclosure is not limited thereto. When the micro semiconductor devices 20 are applied to the photoelectric elements, the light-out structures 20e may further improve the light-emitting efficiency of the micro semiconductor devices 20.

Figure 13:
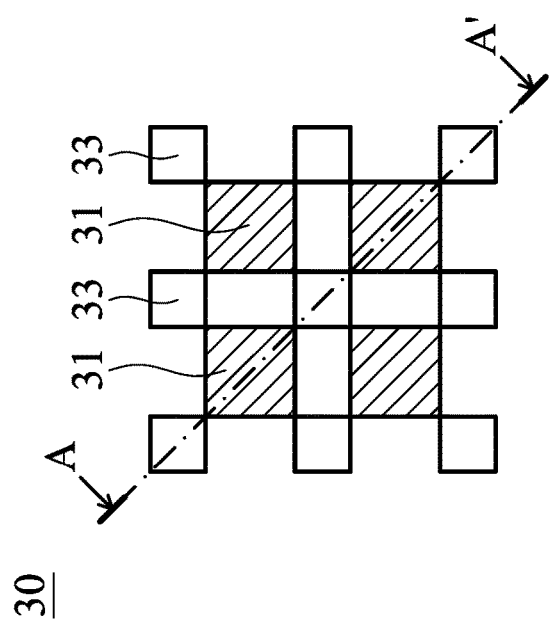
FIG. 13 is a partial top view illustrating the fixing structure according to one embodiment of the present disclosure.
Figure 14:
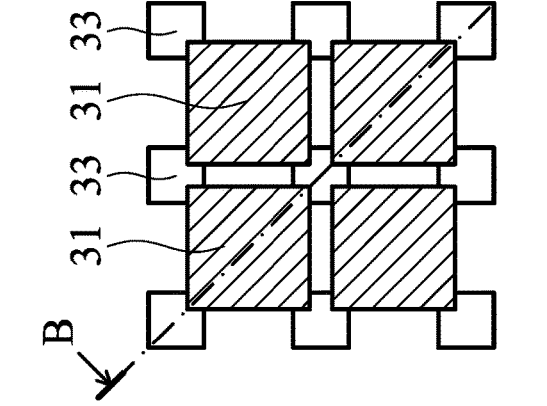
FIG. 14 is a partial top view illustrating the fixing structure according to another embodiment of the present disclosure.

FIG. 13 is a partial top view illustrating the fixing structure 30 according to one embodiment of the present disclosure. FIG. 14 is a partial top view illustrating the fixing structure 30 according to another embodiment of the present disclosure. Here, FIG. 13 and FIG. 14 are top view from the side of micro semiconductor devices 20 (or 22, 24, 26) to the substrate 10 and omitting the substrate 10 and the micro semiconductor devices 20 (or 22, 24, 26). The fixing structures 30 shown in FIGS. 1, 4 and 7 may be, for example, cross-sectional view along line A-A' of FIG. 13, and the fixing structures 30 shown in FIGS. 2, 5 and 8 may be, for example, cross-sectional view along line B-B' of FIG. 14, but the present disclosure is not limited thereto.

As shown in FIG. 13 and FIG. 14, in some embodiments, the plurality of supporting layers 33 of the fixing structure 30 may be separated from each other. For example, the supporting layer 33 may be arranged in an array and respectively disposed at four corners of each conductive layer 31 to form an island-shaped supporting layer 33, but the present disclosure is not limited thereto.

Figure 15:
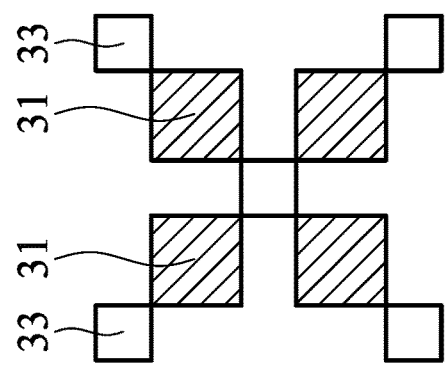
FIG. 15 is a partial top view illustrating the fixing structure according to another embodiment of the present disclosure.

FIG. 15 is a partial top view illustrating the fixing structure 30 according to another embodiment of the present disclosure. As shown in FIG. 15, the plurality of supporting layers 33 of the fixing structure 30 may be arranged in a regular manner and disposed at two corners of each conductive layer 31, not at the four corners of each conductive layer 31. That is, the present disclosure does not limit the arrangement of the supporting layers 33.

Figure 16:
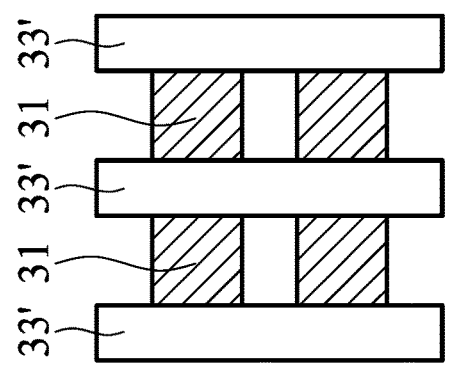
FIG. 16 is a partial top view illustrating the fixing structure according to one embodiment of the present disclosure.
Figure 17:
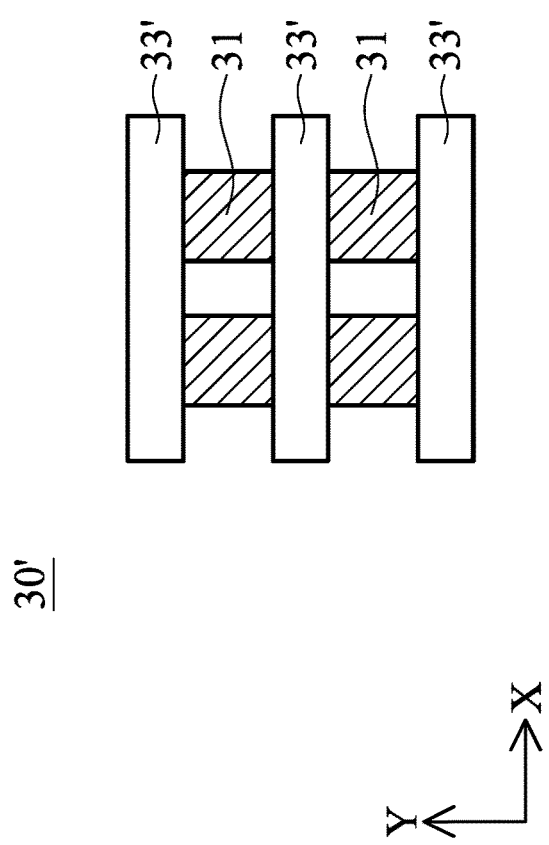
FIG. 17 is a partial top view illustrating the fixing structure according to another embodiment of the present disclosure.

FIG. 16 is a partial top view illustrating the fixing structure 30' according to one embodiment of the present disclosure. FIG. 17 is a partial top view illustrating the fixing structure 30' according to another embodiment of the present disclosure. In some embodiments, the plurality of supporting layers 33' of the fixing structure 30' may be separated from each other. Moreover, the plurality of support layers 33' may be parallel to each other. That is, the orthogonal projections of these supporting layers 33' on the substrate 10 are parallel to each other to form parallel supporting layers 33', but the present disclosure is not limited thereto.

For example, the orthogonal projection of each supporting layer 33' on the substrate 10 may extend in Y direction as shown in FIG. 16; the orthogonal projection of each supporting layer 33' on the substrate 10 may extend in X direction as shown in FIG. 17. In other embodiments, the extending direction of each supporting layer 33' may be different from the direction shown in FIG. 16 or FIG. 17.

Figure 18:
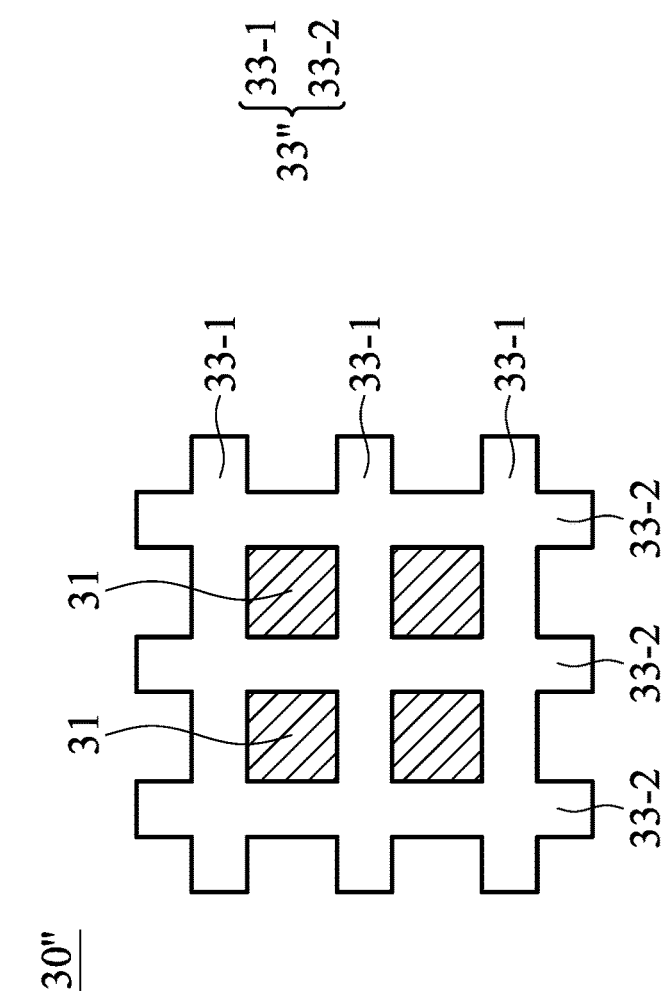
FIG. 18 is a partial top view illustrating the fixing structure according to one embodiment of the present disclosure.

FIG. 18 is a partial top view illustrating the fixing structure 30" according to one embodiment of the present disclosure. In this embodiment, the supporting layers 33" may form a net structure, and the net structure may include a plurality of first sub-supports 33-1 and a plurality of second sub-supports 33-2.

For example, as shown in FIG. 18, the orthogonal projection of each of the first sub-supports 33-1 on the substrate 10 extends in a first direction (X direction), and the orthogonal projection of each of the second sub-supports 33-2 on the substrate 10 extends in a second direction (Y direction), which is different from the first direction. In this embodiment, the second direction is perpendicular to the first direction, but the present disclosure is not limited thereto. The supporting layers 33" formed into the net structure may further enhance the supporting force to more stably support the micro semiconductor devices 20.

FIG. 19 is a partial cross-sectional view illustrating a micro semiconductor display device 200 according to one embodiment of the present disclosure. For example, the micro semiconductor display device 200 may be a device after the micro semiconductor devices 20 are transferred to the receiving substrate of the heterogeneous integrated system, but the present disclosure is not limited thereto.

As shown in FIG. 19, the micro semiconductor display device 200 includes a receiving substrate 40, a plurality of micro semiconductor devices 20 and a plurality of conductive layers 31. The micro semiconductor devices 20 are disposed on the receiving substrate 40, and the conductive layers 31 are disposed between the receiving substrate 40 and the micro semiconductor devices 20. In this embodiment, the area of the orthogonal projection of the micro semiconductor device 20 on the receiving substrate 40 is smaller than the area of the orthogonal projection of the corresponding conductive layer 31 on the receiving substrate 40, but the present disclosure is not limited thereto.

In some embodiments, the receiving substrate 40 may be, for example, a display substrate, a substrate having functional elements such as a thin film transistor (TFT) or an integrated circuit (IC), or other types of circuit substrates, but the present disclosure is not limited thereto.

As shown in FIG. 19, in some embodiments, the micro semiconductor display device 200 may further include a plurality of bonding layers 50 disposed between the receiving substrate 40 and the conductive layers 31. The bonding layers 50 may be used to bond the conductive layers 31 to be electrically connected to the micro semiconductor devices 20, which may further enhance the yield of the micro semiconductor devices 20 bonded to the receiving substrate 40. In some embodiments, the material of the bonding layer 50 may include a metal, a conductive polymer, or a metal oxide, but the present disclosure is not limited thereto.

In the embodiment shown in FIG. 19, the area of the orthogonal projection of each of the bonding layers 50 on the receiving substrate 40 is smaller than the area of the orthogonal projection of the corresponding conductive layer 31 on the receiving substrate 40, so that the conductive layer 31 may be completely contact with the bonding layer 50 and the bonding tolerance may be increase, but the present disclosure is not limited thereto. In other embodiments, the area of the orthogonal projection of each of the bonding layers 50 on the receiving substrate 40 may be equal to or larger than the area of the orthogonal projection of the corresponding conductive layer 31 on the receiving substrate 40.

The foregoing embodiments are described by taking a plurality of micro semiconductor devices on the substrate 10 as an example, but the present disclosure is not limited thereto. FIG. 20 is a partial cross-sectional view illustrating a semiconductor structure 100' according to one embodiment of the present disclosure. As shown in FIG. 20, the semiconductor structure 100' includes a substrate 10', an epitaxial structure 20' and a fixing structure 30. The epitaxial structure 20' is disposed on the substrate 10', and the fixing structure 30 is disposed between the substrate 10' and the epitaxial structure 20'. The fixing structure 30 includes a plurality of conductive layers 31 and a plurality of supporting layers 33, and the material of each of the conductive layers 31 is different from the material of each of the supporting layers 33. The conductive layers 31 are disposed on the lower surface 20B' of the epitaxial structure 20', and the supporting layers 33 are connected to the conductive layers 31 and the substrate 10.

More specifically, the epitaxial structure 20' may be, for example, an epitaxial structure in which the plurality of micro semiconductor devices 20 shown in FIG. 1 are completely epitaxially grown from a growth substrate (not shown) before the element separation process has been performed.

In summary, the fixing structure in the embodiments of the present disclosure includes the conductive layer and the supporting layer, and the conductive layer and the supporting layer are heterogeneous materials, so that the supporting layer is less likely to remain on the micro semiconductor device, and the circuit contact failure of the micro semiconductor device may be avoided, thereby effectively improving the performance of a subsequently formed heterogeneous integrated system (e.g., a micro light-emitting diode display device). Moreover, the conductive layer of the fixing structure may directly serve as an electrode of the micro semiconductor device (and does not require an additional process), which may further reduce the process time and manufacturing cost of the semiconductor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A semiconductor structure, comprising:
    a carrier substrate without wiring;
    a plurality of micro semiconductor devices disposed on and electrically isolated from the carrier substrate without wiring; and
    a fixing structure disposed between the carrier substrate without wiring and the micro semiconductor devices, the fixing structure comprising:
        a plurality of conductive layers disposed on lower surfaces of the micro semiconductor devices, each of the conductive layers being apart from the carrier substrate without wiring, wherein an air gap exists between the conductive layers and the carrier substrate without wiring; and
        a plurality of non-conductive supporting layers connected to the conductive layers and the carrier substrate without wiring,
        wherein a material of each of the conductive layers is different from a material of each of the non-conductive supporting layers.

2. The semiconductor structure according to claim 1, wherein each of the non-conductive supporting layers is in direct contact with at least one of a side surface or a lower surface of a conductive layer to which the non-conductive supporting layer is connected.

3. The semiconductor structure according to claim 2, wherein an area of an orthogonal projection of each of the micro semiconductor devices on the carrier substrate without wiring is smaller than an area of an orthogonal projection of the conductive layer on the carrier substrate without wiring.

4. The semiconductor structure according to claim 3, wherein a ratio of the area of the orthogonal projection of each of the micro semiconductor devices on the carrier substrate without wiring to the area of the orthogonal projection of the conductive layer on the carrier substrate without wiring is greater than or equal to 0.5, and less than 1.

5. The semiconductor structure according to claim 2, wherein an area of an orthogonal projection of each of the micro semiconductor devices on the carrier substrate without wiring is equal to an area of an orthogonal projection of the conductive layer on the carrier substrate without wiring.

6. The semiconductor structure according to claim 2, wherein an area of an orthogonal projection of each of the micro semiconductor devices on the carrier substrate without wiring is larger than an area of an orthogonal projection of the conductive layer on the carrier substrate without wiring.

7. The semiconductor structure according to claim 6, wherein lower surfaces of the micro semiconductor devices are in direct contact with the non-conductive supporting layers.

8. The semiconductor structure according to claim 1, wherein each of the conductive layers comprises a first conductive portion and a second conductive portion separated from each other.

9. The semiconductor structure according to claim 1, wherein the Young's modulus of each of the conductive layers is greater than the Young's modulus of each of the non-conductive supporting layers.

10. The semiconductor structure according to claim 1, wherein lower surfaces of the micro semiconductor devices, upper surfaces of the non-conductive supporting layers and upper surfaces of the conductive layers are coplanar.

11. The semiconductor structure according to claim 1, wherein the non-conductive supporting layers are separated from each other.

12. The semiconductor structure according to claim 1, wherein the non-conductive supporting layers form a net structure, and the net structure comprises:
  a plurality of first sub-supports, wherein an orthogonal projection of each of the first sub-supports on the carrier substrate without wiring extends in a first direction; and
  a plurality of second sub-supports, wherein an orthogonal projection of each of the second sub-supports on the carrier substrate without wiring extends in a second direction that is different from the first direction.

13. A semiconductor structure, comprising:
  a carrier substrate without wiring;
  an epitaxial structure disposed on and electrically isolated from the carrier substrate without wiring; and
  a fixing structure disposed between the carrier substrate without wiring and the epitaxial structure, the fixing structure comprising:
    a plurality of conductive layers disposed on a lower surface of the epitaxial structure, each of the conductive layers being apart from the carrier substrate without wiring, wherein an air gap exists between the conductive layers and the carrier substrate without wiring; and
    a plurality of non-conductive supporting layers connected to the conductive layers and the carrier substrate without wiring;
  wherein a material of each of the conductive layers is different from a material of each of the non-conductive supporting layers.

* * * * *